(12) United States Patent
Aso

(10) Patent No.: US 7,631,911 B2
(45) Date of Patent: Dec. 15, 2009

(54) TRANSPORTING MACHINE

(75) Inventor: Makoto Aso, Chiba (JP)

(73) Assignee: Seiko Instruments Inc., Chiba (JP)

( * ) Notice: Subject to any disclaimer, the term of this patent is extended or adjusted under 35 U.S.C. 154(b) by 268 days.

(21) Appl. No.: 11/708,814

(22) Filed: Feb. 20, 2007

(65) Prior Publication Data

US 2007/0212544 A1    Sep. 13, 2007

(30) Foreign Application Priority Data

Feb. 20, 2006    (JP)    ............................. 2006-041907

(51) Int. Cl.
B25J 15/06    (2006.01)

(52) U.S. Cl. ..................... 294/64.1; 294/902; 414/941

(58) Field of Classification Search .................. 294/1.1, 294/64.1, 64.3, 902; 414/941
See application file for complete search history.

(56) References Cited

U.S. PATENT DOCUMENTS

| | | | | |
|---|---|---|---|---|
| 4,736,508 A | * | 4/1988 | Poli et al. ..................... | 29/445 |
| 4,778,332 A | * | 10/1988 | Byers et al. .................. | 414/735 |
| 5,280,979 A | * | 1/1994 | Poli et al. .................... | 294/64.1 |
| 5,622,400 A | * | 4/1997 | George ....................... | 294/64.1 |
| 5,669,644 A | * | 9/1997 | Kaihotsu et al. ............. | 294/1.1 |
| 5,833,288 A | * | 11/1998 | Itasaka ....................... | 294/64.1 |
| 5,911,461 A | * | 6/1999 | Sauter et al. ................. | 294/1.1 |
| 6,302,459 B1 | * | 10/2001 | Sung et al. ................... | 294/1.1 |
| 6,709,218 B1 | * | 3/2004 | Freerks et al. ............... | 414/217 |
| 6,896,304 B2 | * | 5/2005 | Li et al. ...................... | 294/64.1 |
| 7,290,813 B2 | * | 11/2007 | Bonora et al. ................ | 294/1.1 |

FOREIGN PATENT DOCUMENTS

JP    H11-071025    3/1999

* cited by examiner

*Primary Examiner*—Dean J Kramer
(74) *Attorney, Agent, or Firm*—Brinks Hofer Gilson & Lione

(57) ABSTRACT

A transporting arm has two protruding support sections. Front ends of the support sections are formed such that a thickness of the support sections decreases toward the front ends of those. A surface of the transporting arm on which a wafer is placed is provided with a plurality of suction holes formed at equal intervals in a fan-shaped region. The wafer is fixed to the transporting arm through the suction holes. The wafer is charged with a large amount of static electricity. The transporting arm is charged with the static electricity. A surface of the transporting arm is coated with a conductive fluorinated graphite material. Therefore, an electrical discharge rate of the transporting arm into an atmosphere increases. Accordingly, elevation of a surface potential of the transporting arm in a floating state can be appropriately suppressed. Reduction of repulsive force due to the static electricity acting between the transporting arm and the wafer leads to reduction of vibration of the wafer.

5 Claims, 4 Drawing Sheets

TRANSPORTING MACHINE

This application claims priority under 35 U.S.C. §119 to Japanese Patent Application No. JP2006-041907 filed Feb. 20, 2006, the entire content of which is hereby incorporated by reference.

BACKGROUND OF THE INVENTION

1. Field of the Invention

The present invention relates to a transporting machine for transporting, for example, thin plate-like wafers.

2. Description of the Related Art

In a process of manufacturing an IC (semiconductor integrated circuit), after a wafer process of building an IC circuit onto a silicon wafer (including diffusion process, etching process, and photolithography process), an assembly process (including back surface grinding process, inspection process, and assembling process) is performed.

In the inspection process in the assembly process, an inspection machine in which a microscope and the like are mounted is used to inspect basic function and characteristics as IC, thereby judging acceptability of a chip.

The silicon wafer, which has undergone the diffusion process and left as it is, has a problem such as high electrical resistance on the back surface due residual oxide thereof.

Therefore, the silicon wafer which has completed the diffusion process is polished or ground to several hundreds μm in the back surface grinding (back grind) process.

The plurality of silicon wafers ground to be thin in the back surface grinding process is accommodated in a dedicated wafer carrier (cassette) having partitions (slits) provided at small intervals.

In the inspection process, when the thin silicon wafer accommodated in the wafer carrier is taken out to be placed on an inspection table (stage) of a microscope or the like, a dedicated transporting machine called a wafer loader is used.

Conventionally, a technique of transporting the thin silicon wafer is suggested in the description of JP 11-71025 A.

According to the description of JP 11-71025 A, there is suggested a technique in which a pair of support bars arranged in parallel to each other are used, thereby reducing bending of a wafer due to its own weight caused when the wafer is transported by a transporting arm having a center coinciding with a center of gravity of the wafer.

Even in a case of using the transporting machine as described above, difficulty in handling the silicon wafer ground to be thin to several hundreds μm in the back surface grinding process makes it difficult to increase yield in the manufacturing process.

The applicant of the present invention has found that a factor to inhibit increase of the yield is vibration of the silicon wafer resulting from static electricity with which the silicon wafer and a transporting arm (support bar) for supporting the silicon wafer are charged.

Specifically, a silicon wafer may be charged with a large amount of static electricity in operations in the wafer process and assembly process.

In a case where a wafer, which is charged by static electricity and contained in a wafer carrier formed of an insulating material, is transported by a transporting arm (support bar) at floating state, which is in turn charged to the same potential as the wafer, a repulsive force acts between the silicon wafer and the transporting arm. Then vibration is caused in the silicon wafer due to the repulsive force (repelling force).

When large vibration occurs during transportation due to the repulsive force, the wafer comes into contact with a partition portion and the like of the carrier and breaks, thereby reducing the yield in the manufacturing process.

SUMMARY OF THE INVENTION

It is therefore an object of the present invention to reduce the vibration that occurs in the wafer during transportation.

According to a first aspect of the present invention, there is provided a transporting machine for transporting a thin plate-like wafer by using a transporting arm in a non-grounded state, and the above-mentioned object is achieved by coating the transporting arm with a substance with high static electricity dissipation property.

According to a second aspect of the present invention, the transporting machine according to the first aspect is characterized in that the transporting arm is coated with a substance located on a negative side in the triboelectric series as compared to a substance constituting a base material of the transporting arm.

According to a third aspect of the present invention, the transporting machine according to the first or second aspect is characterized in that the transporting arm includes a base material made of metal and the transporting arm is coated with a fluorinated graphite material.

According to a fourth aspect of the present invention, the transporting machine according to any one of the first to third aspects is characterized in that the transporting arm takes the wafer out of a cassette having a plurality of wafer accommodating sections and inserts the wafer into the cassette.

According to a fifth aspect of the present invention, the transporting machine according to any one of the first to fourth aspects is characterized in that the transporting arm includes a support section which extends along a surface of the transporting arm, on which the wafer is to be placed, the support section being formed such that a thickness of the support section decreases toward a front end thereof.

According to a sixth aspect of the present invention, the transporting machine according to any one of the first to fifth aspects for transporting a thin disk plate-like wafer is characterized in that the transporting arm has a plurality of suction holes, which are arranged in a fan shape with a center coinciding with that of the wafer in a placed state, for sucking and fixing the wafer.

According to the present invention, the transporting arm is coated with a substance having high static electricity dissipation property, whereby the static electricity, with which the transporting arm is charged, is discharged to the atmosphere more easily. Therefore, elevation of the potential of the transporting arm in the non-grounded state can be suppressed. As a result, reduction of the repulsive force acting between the transporting arm and the wafer enables reduction of vibration in the wafer caused by the effect of the static electricity.

DETAILED DESCRIPTION OF THE PREFERRED EMBODIMENT

Hereinafter, a preferred embodiment of the present invention will be described in detail with reference to FIGS. 1 to 4.

(1) Outline of the Embodiment

A description will be made on a wafer transporting system called a wafer loader for transporting thin silicon wafers, which are accommodated while being placed on partition plates (slits) of a wafer carrier, by allowing the silicon wafers to be sucked and fixed on a surface of the transporting arm one by one.

The transporting arm for transporting the silicon wafer has two protruding support sections of a fork shape (bifurcate) like a fork of a forklift.

Each of front ends of the support sections is formed such that the thickness thereof decreases toward a front portion (front end) thereof.

A surface of the transporting arm, on which the silicon wafer is to be placed, is provided with a plurality of suction holes formed in an inner portion of a fan-shaped region at equal intervals. By generating a vacuum in the suction holes provided in the fan-shaped arrangement, the silicon wafer is sucked and fixed on the transporting arm.

The silicon wafer is charged with a large amount of static electricity due to friction with the wafer carrier or the like in operations in the wafer process (including diffusion process, etching process, and photolithography process) and the back surface grinding process of the assembly process. The transporting arm is charged with the static electricity.

In order to promote electrical discharge to an atmosphere, a surface of a base material made of metal of the transporting arm is coated with fluorinated graphite having conductivity.

The coating improves discharge rate of electricity to the atmosphere from the transporting and suppresses increase in the potential on the surface of the transporting arm in a floating state appropriately.

As a result, reduction in the repulsive force, resulting from the static electricity and acting between the transporting arm and the silicon wafer, leads to reduction of the vibration of the silicon wafer.

(2) Detail of the Embodiment

Figure 1:
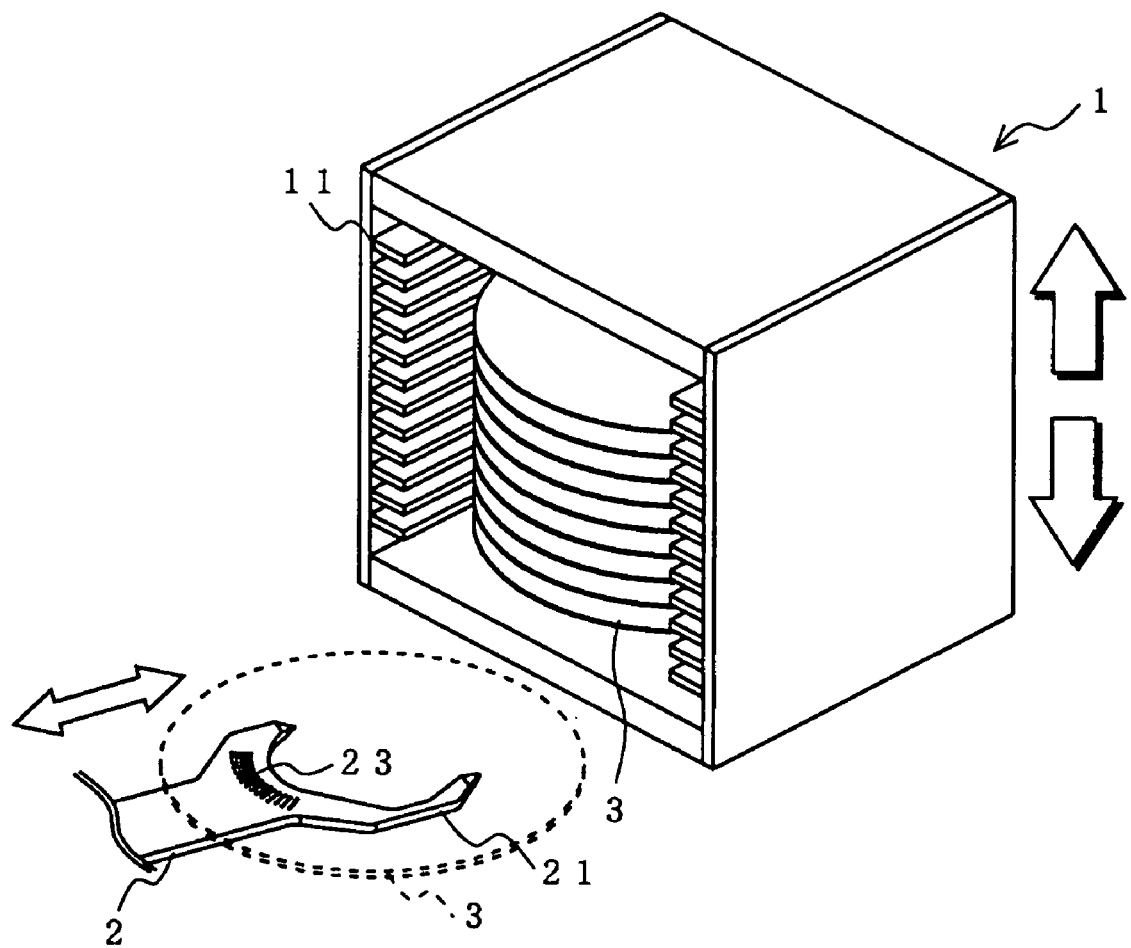
FIG. 1 is a view showing a schematic structure of a wafer transporting system according to an embodiment of the present invention.

FIG. 1 is a view showing a schematic structure of the wafer transporting system according to this embodiment.

As shown in FIG. 1, the wafer transporting system includes a wafer carrier 1 and a transporting arm 2.

The wafer transporting system is a system for allowing silicon wafers 3 accommodated in the wafer carrier 1 to be transported to certain positions after taking out the silicon wafers 3 by using the transporting arm 2, and allowing the silicon wafers 3 to be accommodated in the wafer carrier 1.

The wafer transporting system is used, for example, in a case where the silicon wafer 3 is set in an inspection machine such as a microscope, or a case where the inspected silicon wafer 3 is accommodated in the wafer carrier 1 at a time of inspection in an inspection process for the manufacture of an IC (semiconductor integrated circuit).

Further, although not shown in the drawings, the wafer transporting system is provided with a drive control device for the transporting arm 2, a drive control device for the wafer carrier 1, a position detecting device for the wafer, and the like.

The silicon wafer 3 is a material for manufacturing a semiconductor device and is a disk (disk plate)-like thin plate obtained by slicing a semiconductor ingot (silicon).

Note that, the silicon wafer 3 according to this embodiment is previously subjected to operations in the wafer process for building an IC circuit and in the back surface grinding process of the assembly process.

Note that, the silicon wafer 3 is an extremely thin substrate ground (polished) to have a thickness of about several hundreds μm.

The wafer carrier 1 is a storage cassette (box) for loading a large number of silicon wafers 3 therein.

As shown in FIG. 1, the wafer carrier 1 is a box shape member having an opening. On left and right side surfaces adjacent to the opening, a large number of partition plates 11, which protrude inwardly, are provided in a height direction at equal intervals.

An edge portion of the silicon wafer 3 is placed on the partition plates 11 provided in the wafer carrier 1.

Note that, the intervals at which the partition plates 11 are arranged is determined according to a standard pitch size common to manufacturing lines or machines.

The wafer carrier 1 is composed of an insulating material such as plastic or a fluororesin.

Figure 2A:
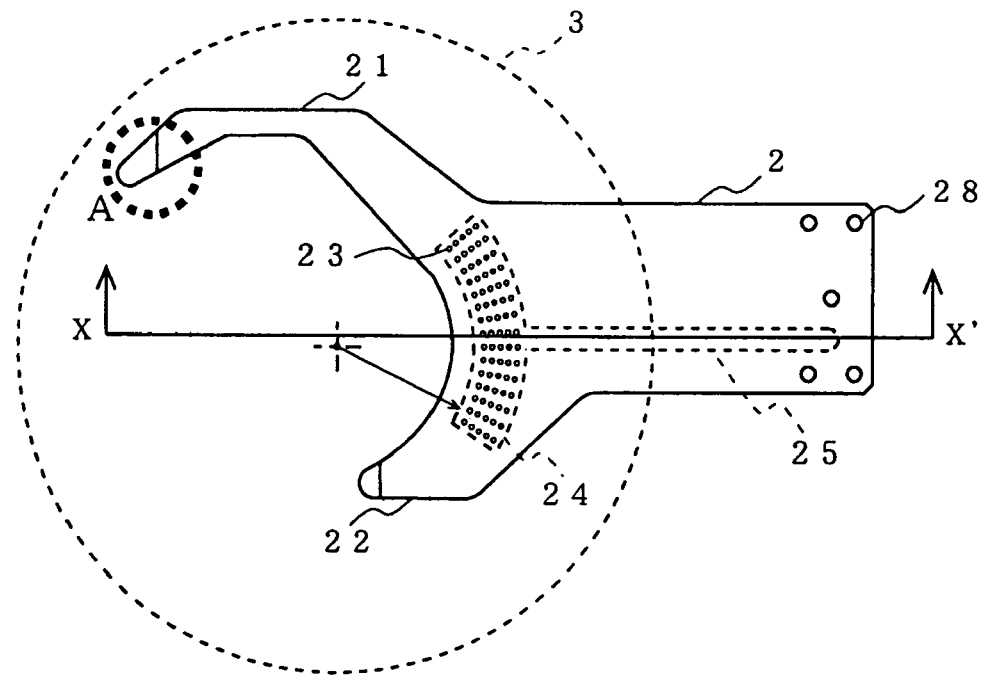
FIG. 2A is a plan view of the transporting arm.
Figure 2B:
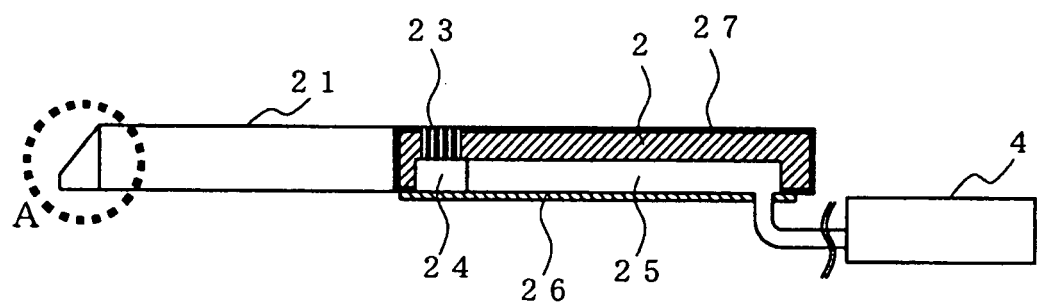
FIG. 2B is a view of a section of the transporting arm taken along the line X-X' of FIG. 2A.

FIG. 2A is a plan view of the transporting arm 2, and FIG. 2B is a view of a section of the transporting arm 2 taken along the line X-X' of FIG. 2A.

As shown in FIGS. 2A and 2B, the transporting arm 2 has support sections 21 and 22 extending from a base portion of the transporting arm 2 along the surface thereof, on which the silicon wafer 3 is to be placed.

The transporting arm 2 according to this embodiment has the support section 21 and the support section 22 of different lengths. However, the shapes of the support sections 21 and 22 are not limited to those. For example, the support sections 21 and 22 may be formed in a fork (comb) shape to have the same length.

The support sections 21 and 22 each are formed such that a thickness thereof decreases toward a front end thereof. As shown in a portion A of each of FIGS. 2A and 2B, the support sections 21 and 22 are formed to have a pointing shape at the front ends thereof.

An end portion of the transporting arm 2 is provided with fitting holes 28 for a fastening member used for fixing the transporting arm 2 to a joining member for supporting the transporting arm 2.

Further, the transporting arm 2 is provided with a plurality of suction holes 23 for sucking the silicon wafer 3 formed in the base portion of the transporting arm 2.

The suction holes 23 are holes which passes through the plate-like base material of the transporting arm 2 in a thickness direction thereof, and the plurality of suction holes 23 are arranged at equal intervals in a fan-shaped region having a center coinciding with a center of the silicon wafer 3 which is placed thereon.

On the back surface of the base material of the transporting arm 2, there is provided a concave portion 24 along a region in which the suction holes 23 are formed. Further, in the back surface of the base material of the transporting arm 2, a concave passage 25 communicating with the concave portion 24, that is, a groove is formed. An end portion of the concave passage 25 is connected to a duct for a suction control device 4.

On the back surface of the base material of the transporting arm 2, there is formed a sealing plate 26 for sealing the concave portion 24 and the concave passage 25.

Further, to the transporting arm 2 according to this embodiment, a coating 27 of a fluorinated graphite material is applied on a surface of the base material made of a metal material such as a SUS (stainless steel) material.

Next, a description will be made of a method of transporting the silicon wafer 3 in the wafer transporting system structured as described above.

The drive control device for the wafer carrier 1 (not shown) adjusts a position of the wafer carrier 1 according to a predetermined position that is a height at which the silicon wafer 3 to be transported next is accommodated.

After completion of positioning of the wafer carrier 1, the drive control device for the transporting arm 2 allows the transporting arm 2 into the wafer carrier 1.

Figure 3:
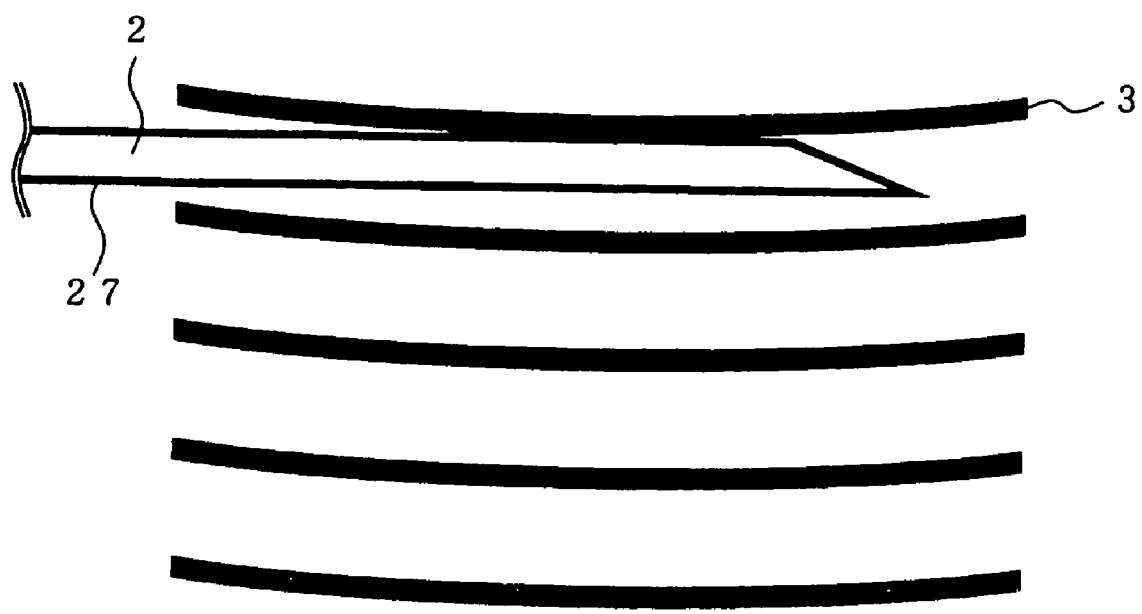
FIG. 3 is a view schematically showing a manner in which the transporting arm is inserted into a wafer carrier.

At this time, as shown in FIG. 3, since the thin silicon wafer 3 accommodated in the wafer carrier 1 is bending, the transporting arm 2 is inserted such that the surface of the transporting arm 2 on which the wafer is placed comes into contact with a part of the back surface of the silicon wafer 3.

After the transporting arm 2 is sufficiently inserted, the drive control device for the transporting arm 2 controls the suction control device 4 to start suction of the silicon wafer 3.

The drive control device for the transporting arm 2 allows the silicon wafer 3 to be drawn out (taken out) from the wafer carrier 1 while being sucked by the transporting arm 2 and allows the silicon wafer 3 to be moved to a transporting destination.

At this time, in order to avoid contact between the partition plates 11 of the wafer carrier 1 and the silicon wafer 3, it is preferable that the silicon wafer 3 be sucked by the transporting arm 2, and then, the wafer carrier 1 or the transporting arm 2 be moved such that the silicon wafer 3 is lifted from the partition plates 11.

After allowing the silicon wafer 3 to be moved to an objective transporting destination, the drive control device for the transporting arm 2 ends suction of the silicon wafer 3 and the silicon wafer 3 is released.

In this manner, in the wafer transporting system, a transporting operation of the silicon wafer 3 is performed.

Meanwhile, the silicon wafer 3 is charged with a large amount of static electricity due to operations in the wafer process (including diffusion process, etching process, and photolithography process) and the back surface grinding process of the assembly process, the friction with the wafer carrier 1, or the like. Specifically, the silicon wafer 3 is positively charged.

Since the wafer carrier 1 is formed of an insulating material, the static electricity, with which the silicon wafer 3 is charged, cannot easily dissipate (cannot easily discharge), and the static electricity accumulates in the wafer carrier 1.

In this embodiment, the transporting arm 2 is also not subjected to a grounding treatment for convenience of a structure of the wafer transporting system; the transporting arm 2 is in the floating state.

A part of the static electricity, with which the silicon wafer 3 is charged, dissipates (discharges) to the transporting arm 2 during transportation.

Since the transporting arm 2 is in the floating state, the static electricity, which has escaped from the silicon wafer 3 (static electricity with which silicon wafer is charged), can be released only through electrical discharge due to friction with the atmosphere.

In a case where the electricity is not sufficiently discharged from the transporting arm 2, since the transporting arm 2 is charged with the static electricity which has escaped from the silicon wafer 3, a surface potential of the transporting arm 2 gradually increases.

When the surface potential of the transporting arm 2 is high, the repulsive force acting between the transporting arm 2 and the silicon wafer 3 which is positively charged, that is, a repelling force therebetween increases.

Due to this effect, the vibration of the silicon wafer 3 becomes larger, the stable transportation of the silicon wafer 3 is made difficult, and further, there is a risk of the silicon wafer 3 coming into contact with the partition plates 11 of the wafer carrier 1 and being damaged.

Therefore, in this embodiment, in order to increase the electrical discharge rate of the transporting arm 2 to suppress elevation of the surface potential of the transporting arm 2, the surface of the transporting arm 2 is applied with the coating 27 of the fluorinated graphite material such that the surface of the transporting arm 2 has conductivity with appropriate resistance.

Note that, the coating 27 is not limited to the fluorinated graphite material, and can be any substance as long as the substance has high static electricity dissipation property.

The substance having high static electricity dissipation property is a substance having property of allowing the charged static electricity to slowly leak out, for example, a substance having a surface resistivity of about 10E5 to 10E12 $\Omega$/sq.

As the substance having high static electricity dissipation property is a substance located on a negative side in the triboelectric series as compared to the base material of the transporting arm 2 (for example, SUS material, iron, aluminum, and ceramic), that is, a substance which is liable to be charged negatively (−) is desirable.

As the material for the coating 27 increasing the electrical discharge rate of the transporting arm 2, a conductive polymer material, a fluororesin material, a polyester material, or the like can be used.

The coating 27 of the fluorinated graphite material used in this embodiment is highly effective in an aspect of costs, and compatibility and adhesiveness with respect to the base material made of metal.

Further, the coating 27 of the fluorinated graphite material has enough abrasive resistance and suitable conductivity.

By coating the transporting arm 2 with the above-mentioned substance, the static electricity (positive charged) accumulating in the transporting arm 2 becomes easy to release (discharge) to the atmosphere during the transportation of the silicon wafer 3. Thus, elevation of the surface potential of the transporting arm 2 can be suppressed.

With this structure, the repulsive force acting between the transporting arm 2 and the silicon wafer 3 can be reduced more. Therefore, the effect of the vibration of the silicon wafer 3 can be reduced (alleviated).

Accordingly, a breakage rate of the silicon wafer 3 can be reduced. Consequently, the yield in the manufacturing process can be increased.

Since the effect of the vibration of the silicon wafer 3 can be reduced (alleviated), the present invention can be applied to a case of transporting thinner silicon wafer 3.

Further, since the effect of the vibration of the silicon wafer 3 can be reduced (alleviated), the intervals between the partition plates 11 in the wafer carrier 1 can be made smaller.

Conventionally, in a case where the transporting arm 2 is formed only of the base material made of the SUS (stainless steel) material, the surface potential of the transporting arm 2 is 200 V, for example. On the other hand, under the same conditions, in a case where the coating 27 of the fluorinated graphite material is applied to the transporting arm 2 the surface potential of the transporting arm 2 can be reduced to about 0 to 20 V, for example.

That is, through the application of the coating 27 of the fluorinated graphite material, an amount of electric charge of the transporting arm 2 can be reduced to about 10% of an amount of electric charge of the transporting arm 2 without the coating 27.

As described above, through the application of the coating 27 of the fluorinated graphite material, sufficient countermeasure against the static electricity of the transporting arm 2 in the floating state can be taken without using a special device such as a static eliminator.

According to this embodiment, application of the coating 27 of the fluorinated graphite material to the transporting arm 2 improves slip on the surface of the transporting arm 2, suppressing generation of a flaw on the back surface of the silicon wafer 3 when the transporting arm 2 is inserted into the wafer carrier 1.

Further, according to this embodiment, by scraping and sharpening the upper surface of the front ends of the support sections 21 and 22 of the transporting arm 2, it is possible to reduce the contact resistance with respect to the back surface of the silicon wafer 3 when inserting the transporting arm 2 into the wafer carrier 1. As a result, the silicon wafer 3 can be transported in a more stable manner.

According to this embodiment, the suction holes 23 of the transporting arm 2 for the silicon wafer 3 is provided in the fan-shaped region having the center coinciding with the center of the silicon wafer 3, that is, the suction is performed in a region having a shape corresponding to the outer peripheral shape of the silicon wafer 3, thereby making it possible to easily enlarge the region where the suction is performed. Accordingly, the silicon wafer 3 can be transported in a more stable manner.

Further, by forming the suction region into the fan shape, the stress acting on a contact portion (suction portion) between the silicon wafer 3 and the transporting arm 2 can be appropriately dispersed, that is, the stress can be suppressed from concentrating thereon unlike in the conventional technique. Therefore, the damage of the silicon wafer 3 can be suppressed at the time of the transporting.

Next, a description will be made of an example of the wafer appearance inspection machine in which the above-mentioned wafer transporting system is mounted.

Figure 4:
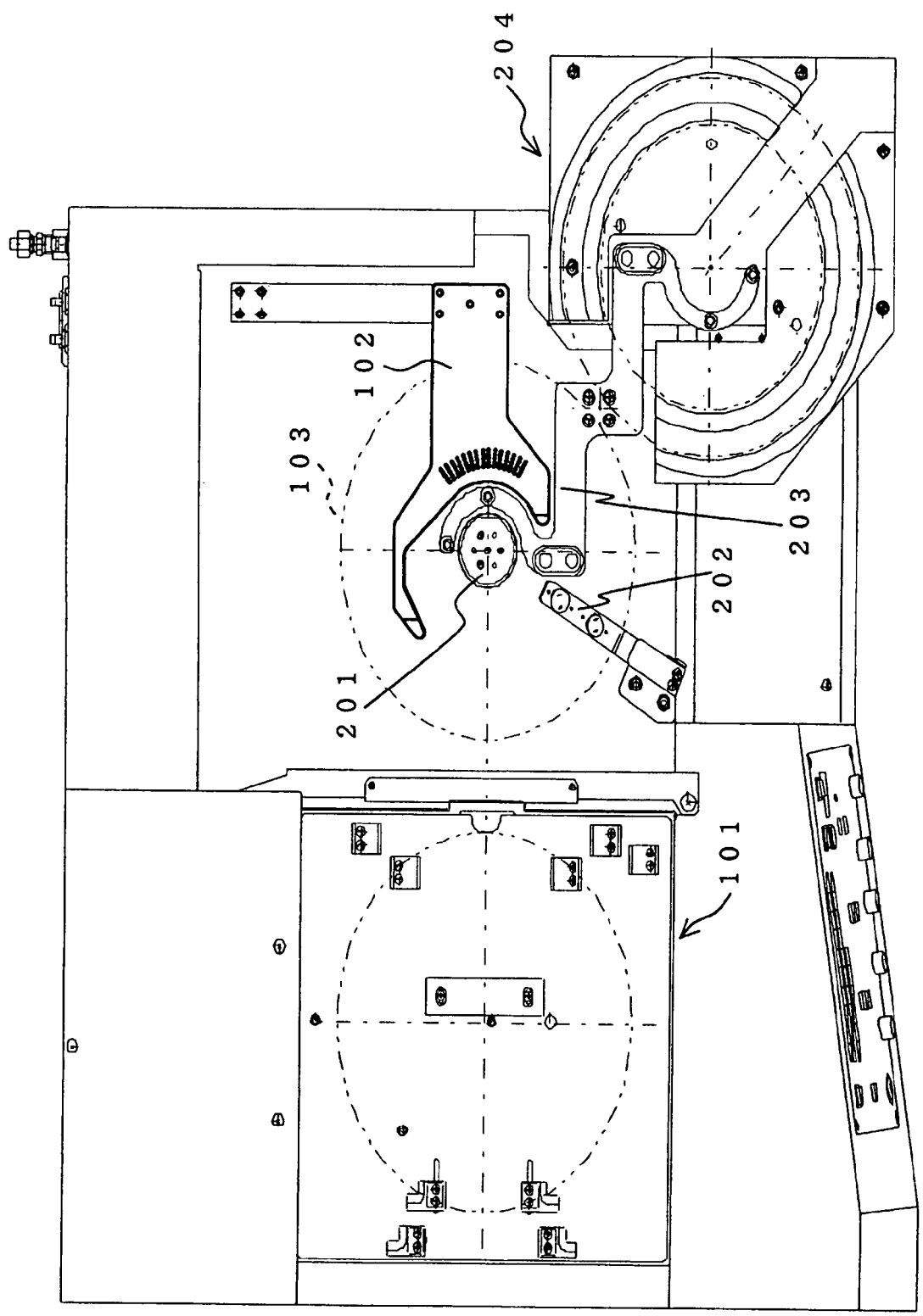
FIG. 4 is a view showing an exemplary schematic structure of a wafer appearance inspection machine.

FIG. 4 is a view showing an exemplary schematic structure of the wafer appearance inspection machine.

Note that, the wafer appearance inspection machine of FIG. 4 is a machine used for both 6-inch wafer and 8-inch wafer.

As shown in FIG. 4, the wafer appearance inspection machine includes a wafer carrier table 101, a transporting arm 102, a stage 201, a detection sensor 202, a rotating arm 203, and an inspection table 204.

The wafer carrier table 101 is a table on which the wafer carrier 1 is placed in the wafer carrier system shown in FIG. 1. The wafer carrier 1 placed on the wafer carrier table 101 accommodates a plurality of semiconductor wafer 103 at predetermined pitches.

The transporting arm 102 has the same structure with the transporting arm 2 of the wafer transporting system and is joined to a connection arm.

The stage 201 is a table on which the semiconductor wafer 103 is temporality placed at a time of delivery of semiconductor wafer 103 between the rotating arm 203 and the transporting arm 102.

The detection sensor 202 serves for detecting a size and a position of the semiconductor wafer 103.

The rotating arm 203 serves for performing transportation of the semiconductor wafer 103 between the stage 201 and the inspection table 204.

On the inspection table 204, inspection of the appearance of the semiconductor wafer 103 is performed.

Next, a description will be made of an operation of the wafer appearance inspection machine structured as described above.

The transporting arm 102 transports the semiconductor wafer 103, which is accommodated in the wafer carrier 1 placed on the wafer carrier table 101 and has not been inspected, to a position of the stage 201 while sucking and holding the semiconductor wafer 103.

The position of the semiconductor wafer 103 transported to the stage 201 is adjusted while being detected by the detection sensor 202.

After the completion of the position adjustment, the transporting arm 102 releases the semiconductor wafer 103 onto the stage 201.

Subsequently, the semiconductor wafer 103 placed on the stage 201 is sucked and held on a predetermined support surface (placing portion) of the rotating arm 203.

The rotating arm 203 is rotated 180° to transport the semiconductor wafer 103 to a position of the inspection table 204.

After a predetermined appearance inspection is performed on the inspection table 204, the rotating arm 203 is rotated again 180° and the semiconductor wafer 103 is placed on the stage 201.

The semiconductor wafer 103 placed on the stage 201 is sucked and held by the transporting arm 102, and the transporting arm 102 is driven while holding the semiconductor wafer 103 to allow the semiconductor wafer 103 to be accommodated (inserted) in the wafer carrier 1 placed on the wafer carrier table 101.

Similarly to the above-mentioned transporting arm 2, the transporting arm 102 is also coated with the fluorinated graphite material applied on the surface of the base material thereof formed of the SUS material.

Increase in an electrostatic discharge rate of the transporting arm 102 in the floating state into the atmosphere enables appropriate suppression of elevation of a surface potential of the transporting arm.

As a result, reduction of repulsive force acting between the transporting arm 102 and the semiconductor wafer 103 leads to reduction of vibration of the semiconductor wafer 103.

What is claimed is:

1. An apparatus for transporting a thin plate-like wafer, comprising:
   a base section formed from a base material, the base section comprising:
      a plurality of suction holes for sucking and fixing the wafer arranged in an arc shape at a first end of the base section; and
      a coating substance that coats the base section, wherein the coating substance is selected for coating based on being located on a negative side in the triboelectric series relative to a location of the base material in the triboelectric series;
   a first support section extending from the first end of the base section; and
   a second support section extending from the first end of the base section and comprising an end portion remote from the base section having a thickness that decreases toward a tip on the end of the second support section, wherein the first support section comprises a length that is longer than a length of the second support section.

2. The apparatus of claim 1, wherein the base material comprises a metal and the coating substance comprises a fluorinated graphite material.

3. The apparatus of claim 1, wherein the plurality of suction holes are arranged at equal intervals.

4. The apparatus of claim 1, wherein the plurality of suction holes are arranged in an arc shape that arcs towards the first end of the base section.

5. The apparatus of claim 1, wherein the first support section comprises an end portion remote from the base section, the end portion comprising a thickness that decreases toward a tip of the end portion of the first support section.

* * * * *